(12) United States Patent
Li et al.

(10) Patent No.: US 11,299,421 B2
(45) Date of Patent: Apr. 12, 2022

(54) ELECTRONIC DEVICE ENCLOSURE WITH A GLASS MEMBER HAVING AN INTERNAL ENCODED MARKING

(71) Applicant: Apple Inc., Cupertino, CA (US)

(72) Inventors: Michael M. Li, San Jose, CA (US); Dale N. Memering, Langhorne, PA (US); Matthew N. Van Dyke, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 181 days.

(21) Appl. No.: 16/540,024

(22) Filed: Aug. 13, 2019

(65) Prior Publication Data

US 2020/0361817 A1 Nov. 19, 2020

Related U.S. Application Data

(60) Provisional application No. 62/846,957, filed on May 13, 2019.

(51) Int. Cl.
| | | |
|---|---|---|
| *B32B 3/00* | (2006.01) | |
| *C03C 23/00* | (2006.01) | |
| *H05K 5/03* | (2006.01) | |
| *H05K 5/00* | (2006.01) | |
| *C03C 21/00* | (2006.01) | |

(52) U.S. Cl.
CPC ........ *C03C 23/0025* (2013.01); *C03C 21/002* (2013.01); *H05K 5/0017* (2013.01); *H05K 5/03* (2013.01)

(58) Field of Classification Search
CPC .................................................. C03C 21/002
See application file for complete search history.

(56) References Cited

U.S. PATENT DOCUMENTS

| 296,631 A | 4/1884 | Schuetz |
|---|---|---|
| 1,608,108 A | 11/1926 | Martus et al. |

(Continued)

FOREIGN PATENT DOCUMENTS

| CH | 689338 | 2/1999 |
|---|---|---|
| CH | 714005 | 1/2019 |

(Continued)

OTHER PUBLICATIONS

Jaeger, "Color Solid Ink Printing," imaging.org, 4 pages, at least as early as Sep. 23, 2014.

*Primary Examiner* — Elizabeth E Mulvaney
(74) *Attorney, Agent, or Firm* — Brownstein Hyatt Farber Schreck, LLP

(57) ABSTRACT

An electronic device may include a housing, a display positioned at least partially within the housing, a cover assembly coupled to the housing and comprising a chemically strengthened glass member, and an encoded marking formed within the chemically strengthened glass member between an upper surface and a lower surface of the chemically strengthened glass member. The encoded marking may include an array of marks, each mark of the array of marks having a dimension between about 3 microns and about 10 microns and set apart from an adjacent mark by an unmarked area of the chemically strengthened glass member. Each mark may represent a bit of information in a binary number system. The encoded marking may be readable, by an optical magnification apparatus, through the upper surface.

20 Claims, 12 Drawing Sheets

(56) References Cited

U.S. PATENT DOCUMENTS

| | | |
|---|---|---|
| 2,473,848 A | 8/1947 | Baxter |
| 2,821,589 A | 1/1958 | Needham |
| 3,123,792 A | 3/1964 | Klemm |
| 3,471,663 A | 10/1969 | Farrell |
| 3,499,281 A | 3/1970 | Denley |
| 3,535,869 A | 10/1970 | Strigini |
| 3,846,697 A | 11/1974 | Giger |
| 3,982,917 A | 9/1976 | Upton |
| 4,227,059 A | 10/1980 | Ogawa |
| 4,340,791 A | 7/1982 | Sorenson |
| 4,598,035 A | 7/1986 | Usami et al. |
| 4,849,618 A | 7/1989 | Namikawa et al. |
| 4,861,620 A | 8/1989 | Azuma et al. |
| 5,180,051 A | 1/1993 | Cook et al. |
| 5,206,496 A | 4/1993 | Clement et al. |
| 5,214,530 A | 5/1993 | Coombs et al. |
| 5,215,864 A | 6/1993 | Laakmann |
| 5,327,201 A | 7/1994 | Coleman et al. |
| 5,496,977 A | 3/1996 | Date et al. |
| 5,523,125 A | 4/1996 | Kennedy et al. |
| 5,607,607 A | 3/1997 | Naiman et al. |
| 5,718,326 A | 2/1998 | Larose et al. |
| 5,761,111 A | 6/1998 | Glezer et al. |
| 5,936,213 A | 8/1999 | Bisquez et al. |
| 6,040,543 A | 3/2000 | Mina et al. |
| 6,084,190 A | 7/2000 | Kenmochi |
| 6,126,309 A | 10/2000 | Bettelini et al. |
| 6,196,738 B1 | 3/2001 | Shimizu et al. |
| 6,201,196 B1 | 3/2001 | Wergen |
| 6,392,683 B1 | 5/2002 | Hayashi |
| 6,565,770 B1 | 5/2003 | Mayer et al. |
| 6,591,457 B1 | 7/2003 | Howie, Jr. |
| 6,630,635 B1 | 10/2003 | Doepner |
| 6,667,450 B2 | 12/2003 | Bulin et al. |
| 6,670,571 B2 | 12/2003 | Dance |
| 6,707,358 B1 | 3/2004 | Massman |
| 6,734,389 B2 | 5/2004 | Troitski |
| 6,744,458 B2 | 6/2004 | Yamada et al. |
| 6,762,381 B2 | 7/2004 | Kunthady et al. |
| 7,060,933 B2 | 6/2006 | Burrowes et al. |
| 7,101,603 B2 | 9/2006 | Okamura et al. |
| 7,165,846 B2 | 1/2007 | Shinya |
| 7,297,221 B2 | 11/2007 | Hikita |
| 7,414,213 B2 | 8/2008 | Hwang et al. |
| 7,531,765 B2 | 5/2009 | Komagata |
| 7,727,618 B2 | 6/2010 | Iwano |
| 8,003,200 B2 | 8/2011 | Nashiki et al. |
| 8,173,253 B2 | 5/2012 | Green et al. |
| 8,198,626 B2 | 6/2012 | Lee et al. |
| 8,222,773 B2 | 7/2012 | De Iuliis et al. |
| 8,232,502 B2 | 7/2012 | Young et al. |
| 8,451,873 B2 | 5/2013 | Zhang |
| 8,529,775 B2 | 9/2013 | Costin et al. |
| 8,640,413 B2 | 2/2014 | Ruggie et al. |
| 8,802,220 B2 | 8/2014 | Cao et al. |
| 8,859,920 B2 | 10/2014 | Manullang et al. |
| 8,859,923 B2 | 10/2014 | Obata et al. |
| 8,867,320 B2 | 10/2014 | Suzuki et al. |
| 8,882,280 B2 | 11/2014 | Fukaya et al. |
| 8,974,924 B2 | 3/2015 | Weber et al. |
| 9,335,868 B2 | 5/2016 | Hotelling et al. |
| 9,346,124 B2 | 5/2016 | Kato et al. |
| 9,600,694 B1 | 3/2017 | Memering et al. |
| 9,629,271 B1 | 4/2017 | Lancaster-Larocque et al. |
| 9,678,258 B2 | 6/2017 | Hankey et al. |
| 9,727,178 B2 | 8/2017 | Matsuyuki et al. |
| 9,790,126 B2 | 10/2017 | Matsuyuki et al. |
| 9,836,684 B2 | 12/2017 | Finn et al. |
| 9,844,898 B2 | 12/2017 | Hill et al. |
| 9,916,048 B2 | 3/2018 | Ishibashi et al. |
| 10,099,506 B2 | 10/2018 | Walker et al. |
| 2005/0287301 A1 | 12/2005 | Ljubomirsky |
| 2006/0024476 A1 | 2/2006 | Leland et al. |
| 2007/0054067 A1 | 3/2007 | Power |
| 2007/0276504 A1 | 11/2007 | Sparer et al. |
| 2008/0042427 A1 | 2/2008 | Muke |
| 2008/0299408 A1 | 12/2008 | Guo et al. |
| 2008/0304525 A1 | 12/2008 | Kupisiewicz et al. |
| 2009/0166343 A1 | 7/2009 | Lappalainen et al. |
| 2009/0237782 A1 | 9/2009 | Takamatsu et al. |
| 2010/0055022 A1 | 3/2010 | Linares et al. |
| 2010/0119808 A1 | 5/2010 | Li et al. |
| 2011/0109590 A1 | 5/2011 | Park et al. |
| 2012/0052275 A1 | 3/2012 | Hashimoto et al. |
| 2012/0328905 A1 | 12/2012 | Guo et al. |
| 2013/0075126 A1 | 3/2013 | Nashner et al. |
| 2013/0112536 A1 | 5/2013 | Shah et al. |
| 2013/0140746 A1 | 6/2013 | Heverly et al. |
| 2014/0363608 A1 | 12/2014 | Lancaster-Larocque et al. |
| 2016/0180212 A1 | 6/2016 | Herslow et al. |
| 2017/0001906 A1 | 1/2017 | Karagoz et al. |
| 2017/0008798 A1 | 1/2017 | Mimoun et al. |
| 2019/0039352 A1* | 2/2019 | Zhao .................. B32B 7/12 |
| 2019/0262948 A1 | 8/2019 | Russell-Clarke et al. |
| 2020/0104549 A1 | 4/2020 | Russell-Clarke et al. |
| 2020/0104550 A1 | 4/2020 | Russell-Clarke et al. |

FOREIGN PATENT DOCUMENTS

| | | |
|---|---|---|
| CN | 1213439 | 4/1999 |
| CN | 1755489 | 4/2006 |
| CN | 1929723 | 3/2007 |
| CN | 101075503 | 11/2007 |
| CN | 105324248 | 6/2008 |
| CN | 101479049 | 7/2009 |
| CN | 101665969 | 3/2010 |
| CN | 101665971 | 3/2010 |
| CN | 101729624 | 6/2010 |
| CN | 101777110 | 7/2010 |
| CN | 101927627 | 12/2010 |
| CN | 102102465 | 6/2011 |
| CN | 201904983 | 7/2011 |
| CN | 201945987 | 8/2011 |
| CN | 201956238 | 8/2011 |
| CN | 202120044 | 1/2012 |
| CN | 102725663 | 10/2012 |
| CN | 102752982 | 10/2012 |
| CN | 202632259 | 12/2012 |
| CN | 102869492 | 1/2013 |
| CN | 202649955 | 1/2013 |
| CN | 102958640 | 3/2013 |
| CN | 202854790 | 4/2013 |
| CN | 103112308 | 5/2013 |
| CN | 103415370 | 11/2013 |
| CN | 103422162 | 12/2013 |
| CN | 203366304 | 12/2013 |
| CN | 103902122 | 7/2014 |
| CN | 104166870 | 11/2014 |
| CN | 204242152 | 4/2015 |
| CN | 105324248 | 2/2016 |
| CN | 107784350 | 3/2018 |
| DE | 102010006665 | 8/2011 |
| EP | 348580 | 1/1990 |
| EP | 0424173 | 4/1991 |
| EP | 1805040 | 7/2007 |
| EP | 2721698 | 4/2014 |
| EP | 3330897 | 6/2018 |
| FR | 2975617 | 11/2012 |
| GB | 581824 | 10/1946 |
| GB | 957644 | 5/1964 |
| GB | 2552406 | 1/2018 |
| JP | H0491875 | 3/1992 |
| JP | H0593811 | 4/1993 |
| JP | 05307088 | 11/1993 |
| JP | H07164787 | 6/1995 |
| JP | 2002137579 | 5/2002 |
| JP | 2009274342 | 11/2009 |
| JP | 201263839 | 3/2012 |
| JP | 201410814 | 1/2014 |
| JP | 201768416 | 4/2017 |
| KR | 20070046983 | 3/2007 |
| KR | 1020090131944 | 4/2010 |
| KR | 20180020704 | 2/2018 |
| TW | 504647 | 1/2002 |

(56) References Cited

FOREIGN PATENT DOCUMENTS

| | | |
|---|---|---|
| TW | 200419720 | 10/2004 |
| TW | I309386 | 5/2009 |
| TW | M414616 | 10/2011 |
| TW | 201231792 | 8/2012 |
| WO | WO01/15916 | 3/2001 |
| WO | WO01/34408 | 5/2001 |
| WO | WO2011/076294 | 6/2011 |
| WO | WO2013/135703 | 9/2013 |
| WO | WO2014/080157 | 5/2014 |
| WO | WO2015/128188 | 9/2015 |
| WO | WO2015/139929 | 9/2015 |
| WO | WO2017/112507 | 6/2017 |

\* cited by examiner

ELECTRONIC DEVICE ENCLOSURE WITH A GLASS MEMBER HAVING AN INTERNAL ENCODED MARKING

CROSS-REFERENCE TO RELATED APPLICATION(S)

This application is a nonprovisional patent application of and claims the benefit of U.S. Provisional Patent Application No. 62/846,957, filed May 13, 2019 and titled "Electronic Device Enclosure with a Glass Member Having an Internal Encoded Marking," the disclosure of which is hereby incorporated herein by reference in its entirety.

FIELD

The described embodiments relate generally to marking glass, and more particularly to laser-marking glass within the bulk of the glass prior to chemical strengthening the glass.

BACKGROUND

Electronic devices, such as smartphones, tablet computers, and the like, may use glass members as transparent covers over their displays. A glass member may act as a protective cover to protect display components, and, in cases where the device includes a touch screen, the glass member may also define the input surface that a user touches to interact with the touch screen. Glass members for electronic devices may be treated or processed to increase their strength, toughness, crack resistance, or other properties. For example, glass members may be thermally tempered or chemically strengthened to improve their properties for use in electronic devices. Glass members may also be marked with words or images. Conventional marking techniques may include surface markings formed from ink or other type of material attached to an exterior surface of the glass member.

SUMMARY

An electronic device may include a housing, a display positioned at least partially within the housing, a cover assembly coupled to the housing and comprising a chemically strengthened glass member, and an encoded marking formed within the chemically strengthened glass member between an upper surface and a lower surface of the chemically strengthened glass member. The encoded marking may include an array of marks, each mark of the array of marks having a dimension between about 3 microns and about 10 microns and set apart from an adjacent mark by an unmarked area of the chemically strengthened glass member. Each mark may represent a bit of information in a binary number system. The encoded marking may be readable, by an optical magnification apparatus, through the upper surface.

The cover assembly may define a transparent region positioned over the display and configured to allow graphical outputs of the display to be viewed through the cover assembly. The cover assembly may also define an opaque region at least partially surrounding the transparent region. The encoded marking may be formed in the opaque region.

The chemically strengthened glass member may define a first compressive stress region extending to a first depth into the chemically strengthened glass member from the upper surface, a second compressive stress region extending to a second depth into the chemically strengthened glass member from the lower surface, and a tensile stress region between the first and second compressive stress regions. The encoded marking may be formed in the tensile stress region.

The encoded marking may be readable, by an optical magnification apparatus, through a side surface of the chemically strengthened glass member, the side surface extending from the upper surface to the lower surface and defining an exterior surface of the electronic device. The encoded marking may be formed before the chemically strengthened glass member is subjected to a chemical strengthening operation.

An electronic device, comprising a housing, a display positioned at least partially within the housing, and a chemically strengthened glass member at least partially covering the display. The chemically strengthened glass member may define a first surface defining an exterior surface of the device and configured to receive touch inputs from a user, a second surface opposite the first surface, and an encoded marking within the chemically strengthened glass member between the first surface and the second surface. The encoded marking may include a first group of marks, each mark in the first group of marks having a dimension between about 3 microns and about 10 microns, and a second group of marks set apart from the first group of marks, each mark in the second group of marks having a dimension between about 3 microns and about 10 microns. The first group of marks and the second group of marks may be not visible to an unaided eye. A distance between the first group of marks and the second group of marks may be greater than a distance between any two marks in the first group of marks. The marks of the first and second groups of marks may have a different index of refraction than an unmarked region of the chemically strengthened glass member.

The first group of marks may be a first portion of an array representing encoded information, and the second group of marks may be a second portion of the array representing the encoded information. The encoded marking may further include a third group of marks set apart from the first and second group of marks, each mark in the third group of marks having a dimension between about 3 microns and about 10, and a fourth group of marks set apart from the first, second, and third groups of marks, each mark in the fourth group of marks having a dimension between about 3 microns and about 10. The chemically strengthened glass member may define a shape with four corners, and each of the first, second, third, and fourth groups of marks may be positioned proximate a respective corner of the four corners.

A method of marking a glass member for an electronic device may include laser forming, along an interior of a glass member, an encoded marking comprising an group of discrete marks each having a dimension between about 3 microns and about 10 microns, and, after laser forming the encoded marking, chemically strengthening the glass member. Chemically strengthening the glass member may include placing the glass member in an ion exchange bath and, while the glass member is in the ion exchange bath, heating the glass member as a result of contact between the glass member and the ion exchange bath. The method may further include encoding a unique identifier into a two-dimensional array. The discrete marks may be arranged in a pattern that corresponds to the two-dimensional array.

The method may further include removing the glass member from the ion exchange bath and, after removing the glass member from the ion exchange bath, optically analyzing the glass member to optically detect the encoded marking. Optically analyzing the glass member may include placing the glass member in a fixture configured to position the encoded marking in a fixed position relative to an optical magnification apparatus, and capturing an image of the encoded marking with the optical magnification apparatus. The method may further include decoding the encoded marking to extract the unique identifier from the encoded marking and associating the unique identifier with data relating to the glass member.

The glass member may define an upper surface and a lower surface. The encoded marking may be positioned between a first area of the upper surface and a second area of the lower surface, and the method may further include, after chemically strengthening the glass member, applying an opaque coating to at least the second area of the lower surface.

Laser forming the encoded marking may include laser forming a first partial marking in a first region of the glass member and laser forming a second partial marking in a second region of the glass member, the second region set apart from the first region. Laser forming the encoded marking may include applying an index-matching material to a surface of the glass member, and directing a laser beam through the index-matching material and through the surface to form the group of discrete marks.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
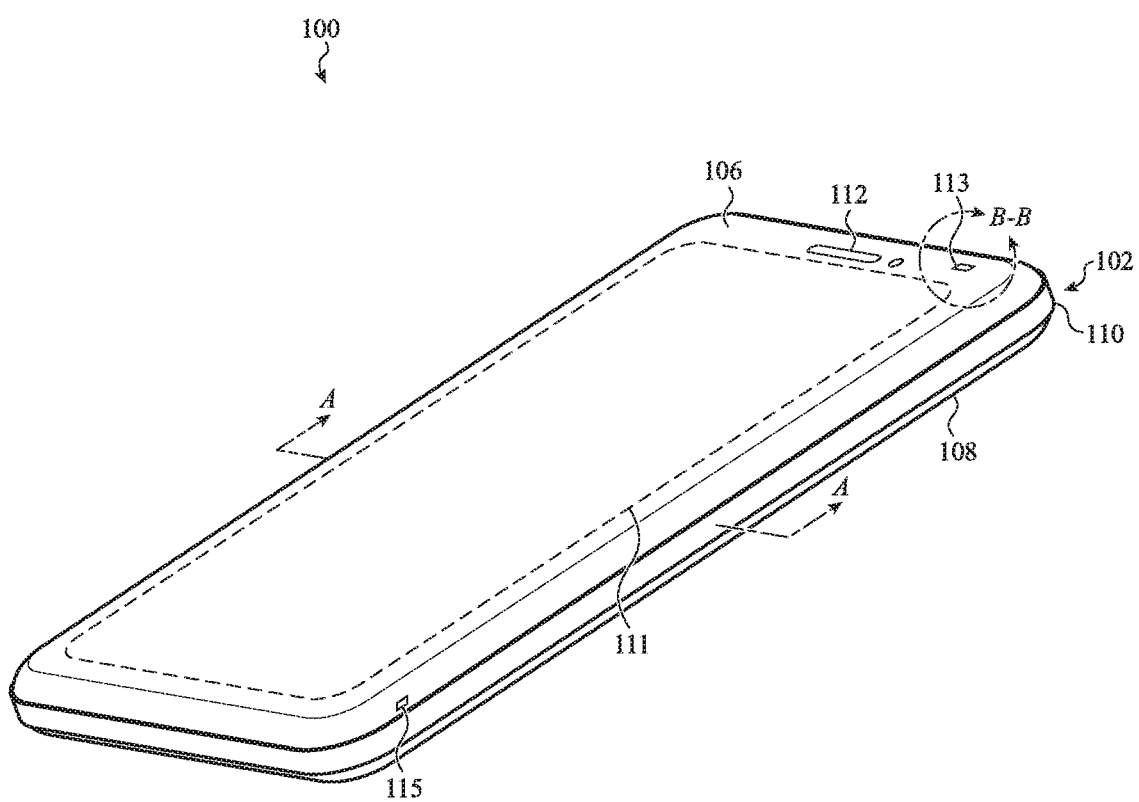
FIG. 1A depicts an example electronic device.

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

The embodiments herein are generally directed to glass members that are used as protective covers or other housing components for electronic devices such as smartphones, tablets, laptop computers, and the like. More particularly, the embodiments are directed to glass members that are laser marked with encoded markings formed with the glass members, such as along a middle or central plane between the upper and lower major surfaces. The encoded markings, which may be visible only with a magnifying apparatus, may encode data such as a serial number or other identifier that can be used to track the glass member or information about the glass member. Information about the glass member, including information about manufacturing steps, conditions, or operations to which the glass was subjected, lot numbers, manufacturing dates, actual processing parameters to which that particular glass member was subjected (e.g., an actual process temperature, time, composition, etc.), an identifier of a mother sheet from which the glass member was singulated, and the like, may be associated with the identifier that is represented by the encoded marking. Such information may be maintained in one or more databases, and additional information may be associated with the identifier as additional operations are performed on or with the glass member. In some cases, any of the foregoing types of information may be encoded directly by the encoded marking.

By positioning the encoded markings within the glass, rather than on a surface of the glass, the markings may remain undamaged or unchanged even through polishing, grinding, or other manufacturing operations that affect the surface of a glass member. The encoded markings may also be configured so that they are still visible (e.g., with a magnification apparatus) even after strengthening operations such as chemical strengthening. For example, encoded markings may be formed within glass members before the glass members are subjected to a chemical strengthening operation. Chemical strengthening operations result in heating of the glass, which may affect the presence or visibility of laser-formed markings within the glass. In particular, the heating of the glass during chemical strengthening may result in the markings disappearing, shrinking, or otherwise becoming less visually distinctive or identifiable. Accordingly, the particular techniques for forming the encoded markings, as well as the physical parameters of the encoded markings, may be selected so that the encoded markings survive through strengthening processes or other operations that result in heating of the glass. For example, the encoded markings may be formed of arrays of individual marks (e.g., dots or rounded shapes), where each mark has a dimension (e.g., a diameter, where the mark is round or circular) within a particular size range. One example range for the dimension of the marks is between about 3 microns and about 10 microns). The marks may be formed using lasers having particular wavelengths and other laser parameters that result in markings that do not shrink, disappear, or otherwise become undetectable as a result of strengthening operations.

As noted above, the individual marks that form an encoded marking may be very small (e.g., less than 10 microns) so that they are not visible to the unaided eye. In this way, the encoded markings may be placed in locations that are not hidden or otherwise obscured from the user. For example, a conventional serial number that is readable by a person (e.g., without magnification) may be applied on an opaque layer on the inside of the glass member (e.g., facing the inside of the device) so that it is hidden from view under normal use of the device. However, this makes it impossible to read the serial number without removing the glass member from the device, which may be difficult and may potentially damage the glass or the device. By using the encoded markings described herein, the markings may be made so small that they are not detectable by the unaided eye, but are detectable by a magnification apparatus or other imaging device. Accordingly, the markings may be made so that they are detectable through the exterior surface of the glass member, thus allowing the encoded markings to be read without disassembling the device or otherwise removing the glass member.

FIG. 1A shows an example electronic device 100 (also referred to herein simply as a "device"). The device 100 shown in FIG. 1A is a mobile phone (e.g., a smartphone), but this is merely one representative example of a device that may be used in conjunction with the ideas disclosed herein. Other example devices include, without limitation, music/media players, tablet computers, laptop computers, wearable electronic devices, watches (e.g., mechanical, electrical, or electromechanical), and the like.

The electronic device 100 includes a housing 102 that includes a first glass member 106 and a second glass member 108. The first glass member 106, which may be referred to as a cover member and may be a component of a cover assembly, may cover or otherwise overlie a display and/or a touch sensitive surface (e.g., a touchscreen) of the device 100, and may define an exterior front surface of the device 100. For example, in some cases the first glass member 106 defines part of the exterior front surface of the device 100, and in some cases the first glass member 106 defines all (e.g., 100%) or substantially all (e.g., greater than 90%, greater than 95%, greater than 99%) of the exterior front surface of the device 100. Where the first glass member 106 is positioned over a display (e.g., a touch-sensitive display assembly 111), the region of the first glass member 106 that is covering the display (as represented by the broken line defining the area of the display assembly 111) may be transparent so that graphical outputs displayed by the display are visible through the first glass member 106. This region may also be referred to as a "window region." In some cases, the area around the display assembly 111 (e.g., outside the broken line defining the area of the display assembly) may include an opaque coating, such as an ink, that visually obscures internal components of the device, adhesive layers, and the like. The opaque coating may border one or more sides of, or completely surround, the transparent region of the first glass member 106. This region may also be referred to as a "peripheral region"

The first glass member 106 may include an encoded marking 113 formed within the glass material itself, such as midway between the upper and lower surfaces of the first glass member 106. The encoded marking 113 may be formed of individual marks that are not visible to the unaided eye, but are optically detectable by a magnifying apparatus. Because they are not visible without magnification, the encoded marking 113 may be positioned on the first glass member 106 so that they are detectable through the upper, exterior surface of the first glass member 106, and they do not need to be occluded or hidden by masks, opaque layers, or the like. The encoded marking 113 may be formed in an opaque region of a cover assembly. For example, the encoded marking 113 may be formed above an opaque layer that surrounds or borders a display region defined by the display assembly 111. In addition to or instead of forming an encoded marking in the opaque region, an encoded marking may be formed in the transparent "window region" of the first glass member 106.

The encoded marking 113 is positioned so that it is detectable through the upper surface of the first glass member 106, though encoded markings may be positioned elsewhere within the first glass member 106. For example, an encoded marking 115 may be formed within the glass material but configured to be detected through a side surface of the first glass member 106. In this case, as described herein, the configuration of the encoded marking 115 may be different from that used for the encoded marking 113. While FIG. 1A shows two encoded markings 113 and 115, this is merely for explanatory purposes, and more or fewer encoded markings may be used, and they may be positioned differently than what is shown in FIG. 1A. Moreover, the encoded markings 113, 115 are shown formed only on the first glass member 106, though in other implementations encoded markings may be formed in any glass material found on a device (e.g., the second glass member 108, the housing member 110, a camera lens cover, or any other glass material).

The first glass member 106 may also define one or more openings, such as opening 112, to allow internal components such as microphones, cameras, speakers, sensors, and the like, to have access to the surrounding environment of the device 100. The second glass member 108 may define an exterior back surface of the device 100. The first and second glass members 106, 108 may define the entire front and back surfaces, respectively, of the electronic device.

The first and second glass members 106, 108 may be attached to a housing member 110. The housing member 110 may define at least a portion of the side surfaces of the device 100. In some implementations, the first and second glass members 106, 108, and the housing member 110 cooperate to define a smooth, continuous exterior side surface or external sidewall of the device 100. The exterior side surface or external sidewall may be contoured or have a curved profile. The housing member 110 may be formed from or include metal, glass, polymer, ceramic, composite, or any other suitable material or combination of materials. The first and second glass members 106, 108 may be attached to the housing member 110 via any suitable means, including adhesives, fasteners, glass frit bonds, welds, solder joints, or the like.

Either or both of the first and second glass members 106, 108 may be formed from or include a single layer or multiple layers. In the latter case, the multiple layers may be multiple glass layers, combinations of glass and other materials (e.g., plastics, polymers, ceramics, sapphire, etc.), coating layers, oleophobic coatings, paints, inks, or the like. In cases were the members are formed from multiple layers, encoded markings may be formed within the bulk of the material of any glass layer (e.g., between the upper and lower major surfaces of any given glass layer).

In some cases, a non-glass member may be used instead of either or both of the first and second glass members 106, 108. For example, either member may instead be a plastic member, ceramic member, sapphire member, metal member, or the like.

Figure 1B:
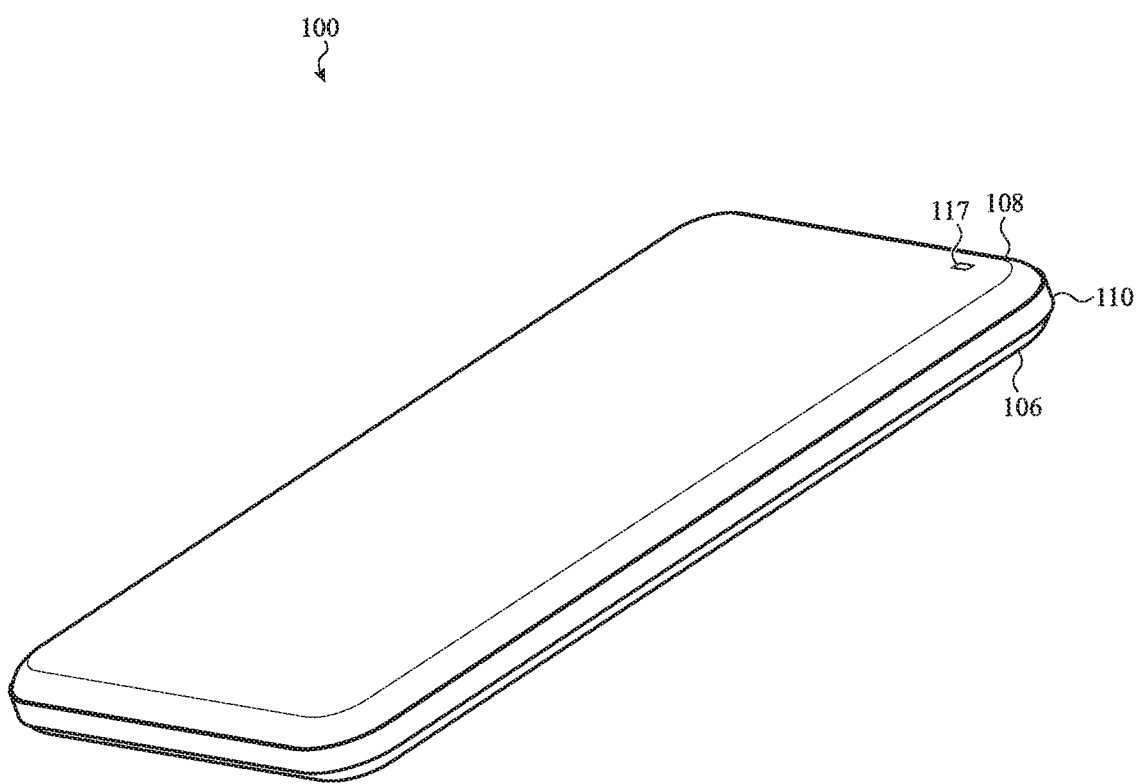
FIG. 1B depicts an alternative view of the electronic device of FIG. 1A.

FIG. 1B shows the back of the device 100. As noted above, the second glass member 108 may define an exterior back surface of the device 100. The second glass member 108 may also include an encoded marking 117, which may be the same as or similar to the encoded markings 113, 115 (or any other encoded marking described herein), and may be formed using the same or similar techniques.

Either or both of the first and second glass members 106, 108 may be chemically strengthened to improve the strength, hardness, toughness, or other physical property of the glass members. For example, the first and second glass members 106, 108 may be formed from or include aluminosilicate glass substrates that have been subjected to chemical strengthening processes. Other substrate materials are also possible, including, without limitation, borosilicate glass, soda lime glass, sapphire, ceramics, polymer materials, or the like. As noted above, the first and/or second glass members 106, 108 may be chemically strengthened after encoded markings are formed within the glass members.

Figure 1C:
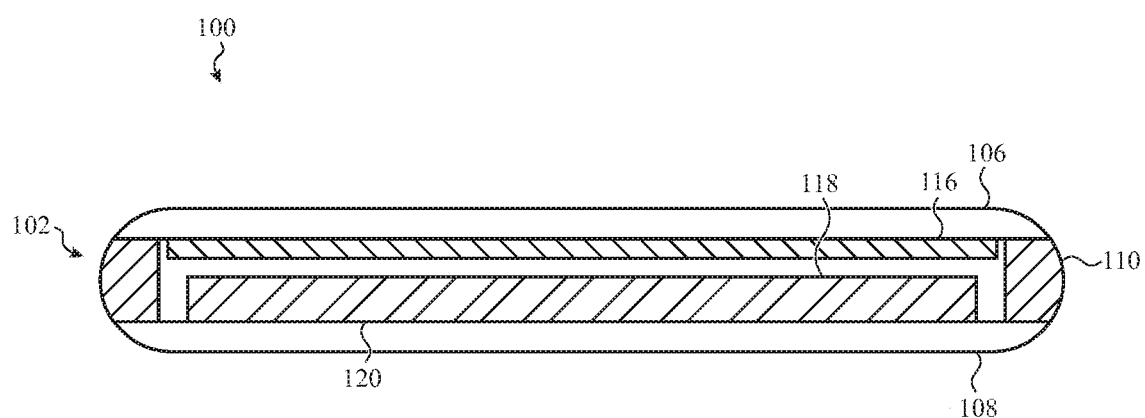
FIG. 1C depicts a partial cross-sectional view of the electronic device of FIG. 1A.

FIG. 1C depicts a partial cross-sectional view of the electronic device 100 of FIGS. 1A and 1B along line A-A in FIG. 1A. The housing member 110 and the first and second glass members 106, 108 at least partially define an interior volume for receiving electronic components. As depicted in FIG. 1C, the device 100 includes a display 116 that is at least partially positioned within the interior volume of the housing 102. In this example, the display 116 is positioned under and coupled to the first glass member 106. The first glass member 106 may also be described as being positioned over the display 116. The display 116 may include a liquid-crystal display (LCD), light-emitting diode, organic light-emitting diode (OLED) display, an active layer organic light emitting diode (AMOLED) display, organic electroluminescent (EL) display, electrophoretic ink display, or the like. In some cases, a touch sensor or touch sensitive layer is positioned under the first glass member 106 and may be configured to detect a touch or multiple touches along an exterior surface of the first glass member 106.

As depicted in FIG. 1C, a component 118 is positioned at least partially within the interior volume. In this example, the component 118 is coupled to the second glass member 108, though in other examples it may be secured to the housing 102 in a different manner. For example, the electronic device 100 may include one or more of a display, an input device, a sensor, memory, a processor, control circuitry, a battery, a circuit board, a frame or other supporting structure, an antenna, or the like. Additional or different components may also be positioned within housing 102. The electronic device 100 may include various systems and/or components that can receive information from or about a user or the user's surroundings (e.g., touchscreens, microphones, biometric sensors, GPS systems). It is well understood that the use of personally identifiable information (such as information from or about a user or the user's environment and that is stored on or accessible by a device) should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

Figure 2A:
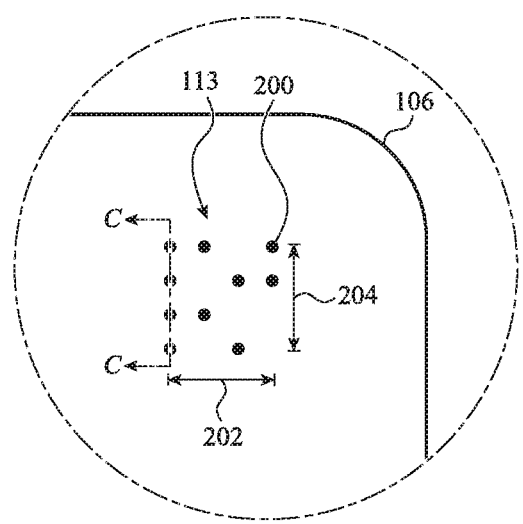
FIG. 2A depicts a detail view of a glass member with an example encoded marking.

FIG. 2A is a detail view of the area B-B in FIG. 1A, showing details of the encoded marking 113. The encoded marking 113 is shown larger than actual scale for illustrative purposes. For example, the encoded marking 113 may include a group of discrete marks 200. The marks 200 may be separated by an unmarked area such that each discrete mark 200 may represent an individual bit or other discrete unit of information. For example, each mark 200, based on its presence and its location, may encode a bit or unit of information or data. As one particular example, each available mark location in an encoded marking may correspond to a particular position of a binary number, and the presence of a mark in that particular mark location corresponds to a value of "1," and the absence of a mark in that particular mark location corresponds to a value of "0." Thus, the presence, absence, and location of individual marks in an array of marks may be used to represent some portion of the encoded information represented by the array.

Each discrete mark 200 may be similar or substantially identical in size and shape, and may have a dimension (e.g., a diameter, where the mark is circular or substantially circular) of between about 1 micron and about 15 microns, between about 4 microns and about 10 microns, between about 5 microns and about 7 microns, or any other suitable dimension. In some cases, the dimension corresponds to a maximum lateral dimension of the mark, such as if the mark is non-circular, where the lateral dimension is in the plane defined by the upper, exterior, surface of the first glass member 106. While the encoded markings are depicted as rounded spots, the encoded markings may additionally or instead include marks having other shapes, such as lines, irregular patterns, squared shapes, triangles, curves, patterns, or the like.

The encoded marking 113 shown in FIG. 2A includes a 4×4 array of discrete marks 200. As used herein, an array may refer to an arrangement of marks that represents encoded information.

Not all of the locations in the 4×4 array include a visible mark 200. Further, while an example arrangement of marks is shown, this arrangement is merely for illustration purposes. For example, any given encoded marking may include a unique combination of marks and empty array positions in order to encode information into the encoded marking. Further, while FIG. 2A shows a 4×4 array, marks 200 may be used to form other types of encoded marks, including, for example, arrays of any other size (e.g., 10×10, 20×20, 40×40, 100×100), or any other encoding scheme such as one-dimensional barcodes, two-dimensional barcodes, QR codes, Data Matrix codes, DotCodes, or the like. As noted above and described herein, the marks 200 may be formed within the first glass member 106 between an upper surface and a lower surface of the glass member.

Figure 2B:
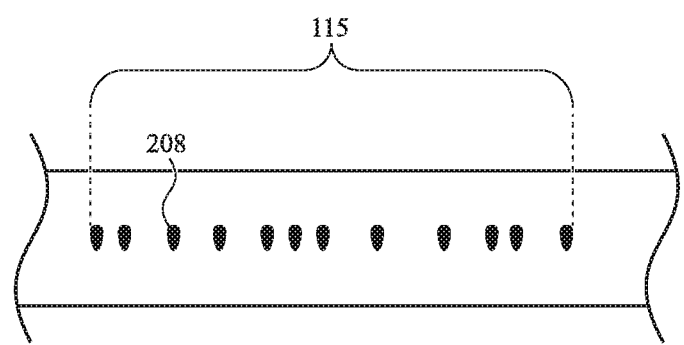
FIG. 2B depicts a detail side view of a glass member with another example encoded marking.

FIG. 2B is a side view of a portion of the first glass member 106, corresponding to an area where the encoded marking 115 is positioned. Whereas FIG. 2A represents a view through the upper surface of the first glass member 106 (e.g., through the front face or surface of the device 100), FIG. 2B represents a view through a side surface of the first glass member 106 (e.g., a side surface that extends from the upper surface to the lower surface and defines an exterior surface of the first glass member 106). In this case, the encoded marking 115 may be a linear arrangement of discrete marks 208, where the presence or absence of a mark 208 in a location, and/or the relative positions of the marks 208 to one another represent or indicate encoded information. In some cases, the linear arrangement may correspond to a binary (base-2) number system, and the presence of a mark in a position may indicate a binary state of "1," while the absence of a mark may indicate a binary state of "0." This is merely one example encoding scheme, however, and any other encoding scheme may be used. Further, such binary encoding schemes may be used in other types of encoded markings, such as the 4×4 array shown in FIG. 2A, or any other two- or three-dimensional arrays, patterns, or other markings.

While FIGS. 2A and 2B show encoded markings being viewed through an upper surface (FIG. 2A) and a side surface (FIG. 2B) of the first glass member 106, either marking may be viewed through other surfaces as well. For example, the encoded marking 115 may be viewed through the upper surface, and the encoded marking 113 may be viewed through one or more side surfaces. More particularly, a magnifying device or apparatus may be configured to view and decode either of the encoded markings through either an upper surface or a side surface.

Figure 3:
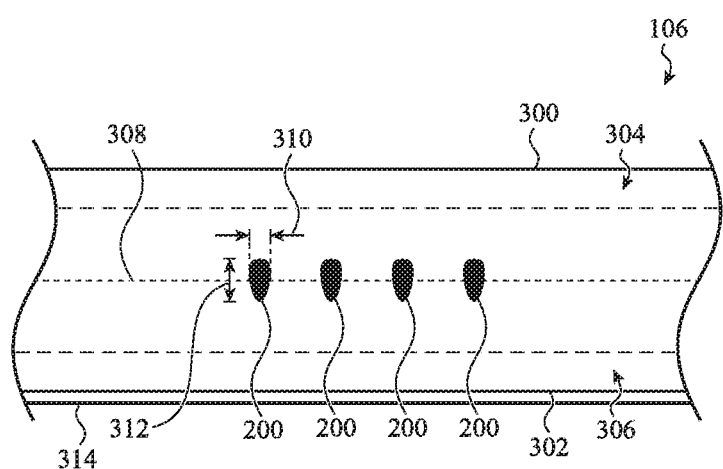
FIG. 3 depicts a partial cross-sectional view of an example chemically-strengthened glass member with an encoded marking within the glass.

FIG. 3 is a partial cross-sectional view of the first glass member 106, viewed along line C-C in FIG. 2A, showing the relative position of the marks 200 within the bulk of the first glass member 106. In particular, the marks 200 of the encoded marking 113 are positioned between an upper surface 300 of the first glass member 106 (e.g., the surface defining the front surface of the device 100) and a lower surface 302 of the first glass member 106 (e.g., a surface that is opposite the upper surface 300 and, optionally, parallel to the upper surface 300). The marks 200 may be positioned on or along a central plane 308 of the first glass member 106, where the central plane 308 is parallel to and equidistant from each of the upper and lower surfaces 300, 302 (where the upper and lower surfaces 300, 302 are also parallel to one another). Positioning the marks 200 along the central plane 308 (or a neutral plane), or any other location within the glass and away from the exterior surfaces, may help protect the marks 200 from damage, fading, or other deleterious effects due to polishing, handling, strengthening, tempering, or other operations to which the glass member may be subjected. Further, by forming the marks 200 along a central plane (or neutral plane) of the first glass member 106, any localized damage associated with the marks 200 may not significantly impact the bending strength of the glass, as the central plane may experience minimal tensile or compressive stresses due to bending of the first glass member 106 (though the marked region may experience some degree of tensile or compressive stress that is a result of a chemical strengthening process).

As described above, the first glass member 106 may be chemically strengthened in order to improve its strength, break resistance, toughness, or other physical properties. Chemical strengthening may be performed by placing the first glass member 106 in an ion exchange bath, which may be a bath of molten salt or some other heated solution or material. This process may result in the glass member being heated as a result of the contact between the glass member and the ion exchange bath. Under certain circumstances, heating of the glass may cause marks to change, fade, disappear, or otherwise become damaged or less visible. Accordingly, the marks 200 may be formed in a manner that allows them to remain visible and/or distinct even after chemical strengthening and any heating that may result. For example, the marks 200 may have a particular size (or fall within a particular size range) so that they are small enough to be not visible to the unaided eye, large enough to be optically detectable with a magnification apparatus, and large enough to not be healed or damaged during heating. For example, the marks 200 may have a first dimension 310 (e.g., a lateral dimension) of between about 1 micron and about 20 microns, between about 4 microns and about 10 microns, between about 5 microns and about 7 microns, or any other suitable dimension. A second dimension 312 (e.g., a depth dimension) of the marks 200 may be any suitable dimension. In some cases, the depth dimension is larger than the lateral dimension, such as about 1.5 times larger, about 2.0 times larger, about 3.0 times larger, or any other suitable size or dimension.

The chemical strengthening operation may result in the first glass member 106 having a first compressive stress regions 304 extending a first depth into the first glass member 106 from the upper surface 300, and a second compressive stress region 306 extending a second depth into the first glass member 106 from the lower surface 302. The compressive stress regions 304, 306 may correspond to areas of increased compressive stress due to the presence of ions in the glass material. Between the compressive stress regions 304, 306 may be a tensile stress region that balances out the compressive stress regions. In some cases, the marks 200 may be entirely within the tensile stress region.

The marks 200 may be defined by a physical change in the glass material that results in a visible marking. The physical change may include structural and/or chemical changes in the glass material. In some cases, the marks 200 may have a different index of refraction than an unmarked portion of the glass. The difference in index of refraction may be due, for example, to small voids within the glass, changes in the microstructure of the glass, discontinuities or boundaries between portions of the glass material, and/or combinations of these phenomena. Due to the difference in refractive index between the marks 200 and the surrounding glass material, the marks 200 may be optically detectable under certain conditions (e.g., under certain magnification and lighting conditions). In some cases, the marks 200 may be transparent but optically distinguishable due to the difference in index of refraction. In other cases, the light transmissivity of the material itself is changed or reduced to form the marks 200.

In some cases an optional layer 314 may be applied to a surface of the first glass member 106. The layer 314 may be an opaque or other light-blocking layer that masks or occludes components within the device that are not intended to be viewed or seen by a user of the device, such as adhesive layers, internal device components, empty space, or the like. The layer 314 may define an opaque frame or border along at least one side of a display, and optionally fully surrounding an outer perimeter of the display. The layer 314 may be on the lower surface 302 of the first glass member 106, and it may be or may include one or more layers of ink, paint, dye, film, foil, polymer, adhesive, resin, or any other suitable material.

The marks 200 may be positioned in the first glass member 106 in a location that corresponds to (e.g., is above) the layer 314, and thus away from a display region where images are viewed through the first glass member 106. In this way, the marks 200 will not distort or otherwise interfere with the visibility or viewing of graphical objects displayed by the display. Alternatively, the marks 200 may be positioned within the display region but are small enough that they do not significantly affect the visual appearance of graphical output produced by the display.

Figure 4:
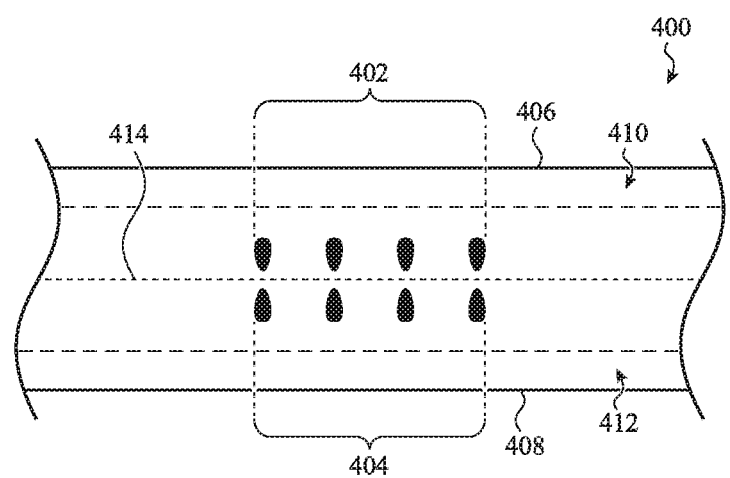
FIG. 4 depicts a partial cross-sectional view of another example chemically-strengthened glass member with an encoded marking within the glass.

FIG. 4 is a partial cross-sectional view of an example glass member 400 that includes two encoded markings at different depths within the glass member 400. The glass member 400 may be an embodiment of the first glass member 106. As such, details of the first glass member 106 may be equally applicable to the glass member 400 and for brevity will not be repeated here.

As shown in FIG. 4, the glass member 400 may include a first encoded marking 402 and a second encoded marking 404. The first and second encoded markings 402, 404 may be the same as or similar to other encoded markings described herein. The first and second encoded markings 402, 404 may be positioned within a tensile stress region of the glass member 400 and at or near a central plane 414, between upper and lower compressive stress regions 410, 412. The first and second encoded markings 402, 404 may encode the same information, or they may encode different information.

The first encoded marking 402 may be positioned at a first depth below an upper surface 406 of the glass member 400, and the second encoded marking 404 may be positioned at a second depth below the upper surface 406. In some cases, the first encoded marking 402 is configured to be viewed through the upper surface 406 and the second encoded marking 404 is configured to be viewed through a lower surface 408. A magnifying apparatus may be configured to focus on only one of the encoded markings 402, 404 (e.g., by targeting its focus distance to the depth of the target marking) so that the other encoded marking is not visible or otherwise does not interfere with viewing or imaging the target encoded marking.

A complete encoded marking may be formed at a single location on a device, as described with respect to the encoded marking 113. In other cases, an encoded marking may be segmented into multiple groups of marks (each corresponding to a partial encoded marking) that are set apart from one another. This may decrease the visibility of the marks to observers, and may afford an additional level of informational security, as it may be harder to find and decode the encoded marking when it is segmented and distributed among multiple partial markings.

Figure 5:
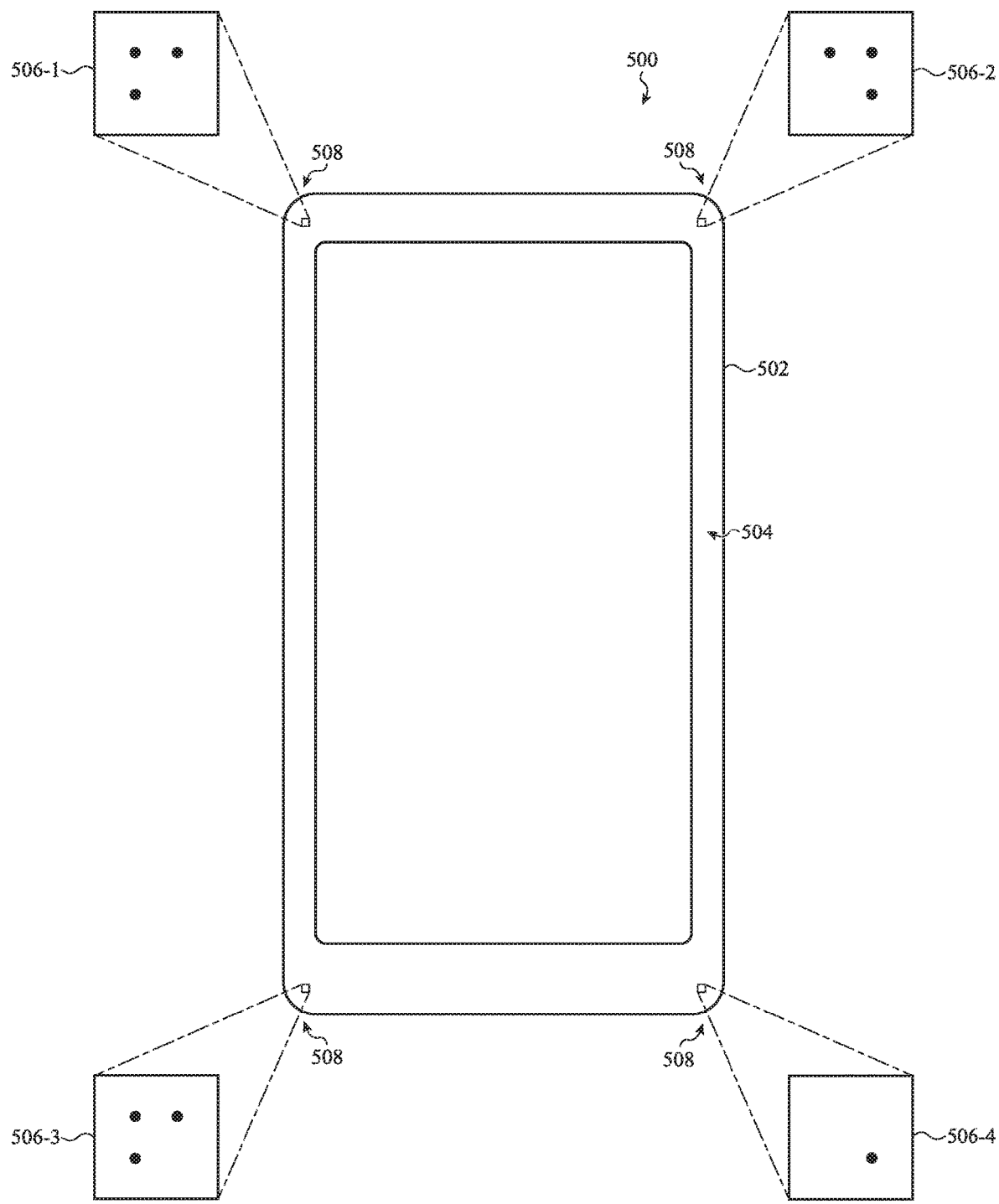
FIG. 5 depicts a front view of an example glass member with an encoded marking separated into multiple segments.

FIG. 5 illustrates a front view of an example device 500 with a glass member 502. The device 500 may be an embodiment of the device 100 and the glass member 502 may be an embodiment of the first glass member 106, and details of those components may apply equally or by analogy to the device 500 and glass member 502. As shown in FIG. 5, an encoded marking may be segmented into multiple groups 506 of marks. As shown there are four groups 506 of marks (e.g., groups 506-1, 506-2, 506-3, and 506-4), though any other number of groups may be used (e.g., two groups, three groups, five groups, etc.). Each mark in the groups 506 of marks may be the same as or similar to the marks 200 or any other marks described herein.

The groups 506 may be separated from one another by a distance that is greater than a distance between individual marks in a single group 506. That is, if the marks in a single group of marks are set apart from adjacent marks by a distance between about 1 and about 100 microns, the groups 506 may be set apart from one another by greater than 100 microns. As shown in FIG. 5, the glass member 502 defines a shape with four corners 508 (e.g., a rectangle, though other shapes are also possible), and each of the groups 506 of marks is positioned proximate a respective one of the corners 508. Each group 506 is shown positioned in an opaque region 504 of the glass member 502, where the opaque region 504 may be defined by an ink layer (or other opaque treatment or material) on the glass member 502.

The groups 506 of marks may be undecipherable individually. For example, an encoding scheme may specify a 4×4 array of potential mark locations to encode information. Desired information may be encoded into the 4×4 array format, and then the resulting 4×4 array may be segmented into four 2×2 sub-arrays (e.g., the groups of marks 506) and distributed among different locations on a glass member. In order to decode the information from the groups 506 of marks, a magnifying imaging device may capture images of each group, form a composite 4×4 array from the groups, and decode the 4×4 array. In this way, a single array that encodes some information may be segmented into sub-arrays, where the sub-arrays are not independently decodable or otherwise do not convey all of the information in the array. In other cases, each group of marks corresponds to a self-contained encoding format that can be decoded independently of the other groups. In such cases, the encoded information represented by the groups may be combined after decoding to retrieve desired information. For example, one group may represent the first two digits of a serial number, another group may represent the next two digits of the serial number, and so forth.

Figure 6A:
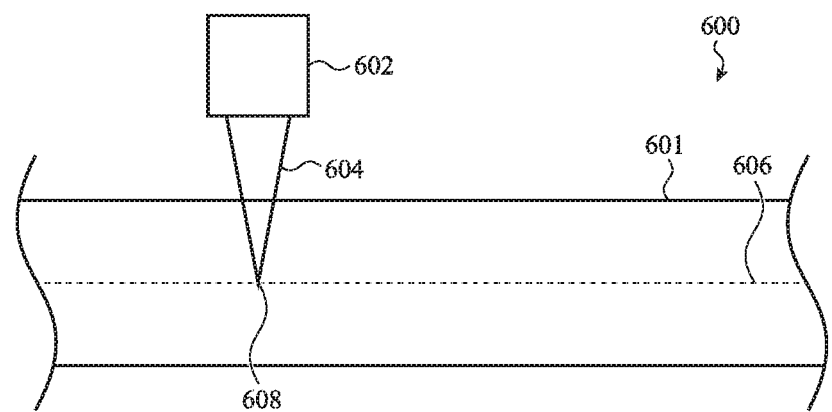
FIG. 6A depicts an example laser marking operation.

As described above, marks for encoded markings may be formed by directing a laser into a glass member prior to chemical strengthening the glass member. In order to form the mark within the glass material, it may be necessary for a laser beam to pass through one of the surfaces of the glass member and focus at a target location within a glass member. FIG. 6A illustrates an example glass member 600 during a marking operation. In particular, a laser source 602 is directing a laser beam 604 through an upper surface 601 of the glass member 600. The laser beam 604 is focusing at a target location 608 (which may be along a central plane 606 (or neutral plane) of the glass member 600). In this example, the upper surface 601 of the glass member 600 is sufficiently smooth so that the laser beam 604 is able to pass through the surface 601 and focus at the target location 608.

Figure 6B:
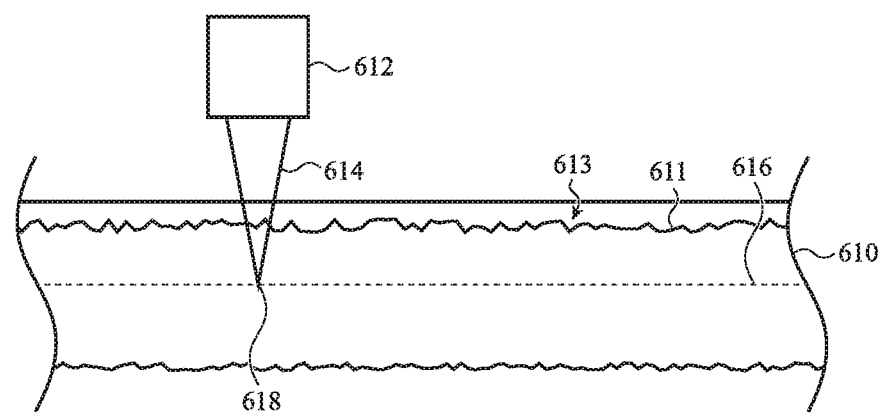
FIG. 6B depicts another example laser marking operation.

FIG. 6B illustrates another example glass member 610 during a marking operation. In this example, the glass member 610 has a surface 611 that has a roughness or texture or other surface irregularity that would prevent a laser beam from effectively passing through the surface 611 and focusing at a target location. Such surface irregularities may be present in cases where, for example, it is desirable for a glass member to be marked prior to a polishing operation. Accordingly, where such surface irregularities exist, an index-matching material 613 may be applied to the surface 611 prior to directing a laser beam 614 (from a laser source 612) into the glass member 610. The index-matching material may have a same or similar index of refraction as the glass of the glass member 610, thereby preventing the laser light from reflecting, refracting, scattering, or otherwise being interfered with at the interface between the irregular surface 611 and the index-matching material 613. Accordingly, the laser beam 614 can focus at the target location 618 to form the mark at the desired location. The index matching material may be a liquid such as an oil, mineral spirits, or any other suitable liquid that has the same or a substantially similar index of refraction as the glass material of the glass member.

After the glass member 610 is marked with the laser beam 614, the index matching material may be removed. In some cases, further processing may take place, such as a polishing operation to remove or reduce the surface irregularity of the surface 611, a chemical strengthening operation, or the like. By applying the marking before operations like polishing and chemical strengthening, information about those operations may be more easily associated with the glass member via the information in the encoded marking. For example, and as described in more detail herein, before or after a polishing operation, a glass member may be visually inspected to detect and decode an encoded marking to identify a unique identifier of that glass member. Information about the polishing operation may then be associated with the unique identifier (e.g., in a database or other computer system). The information may include information such as the duration of the polishing operation, an initial roughness value, a final roughness value, a type of polishing compound, and so forth. Subsequent operations may proceed similarly, with the encoded marking being decoded before and/or after processing operations so that additional information about the processing operations may be associated with the unique identifier. Such information may be valuable, for example, for process optimization, quality control audits, and the like.

Figure 7:
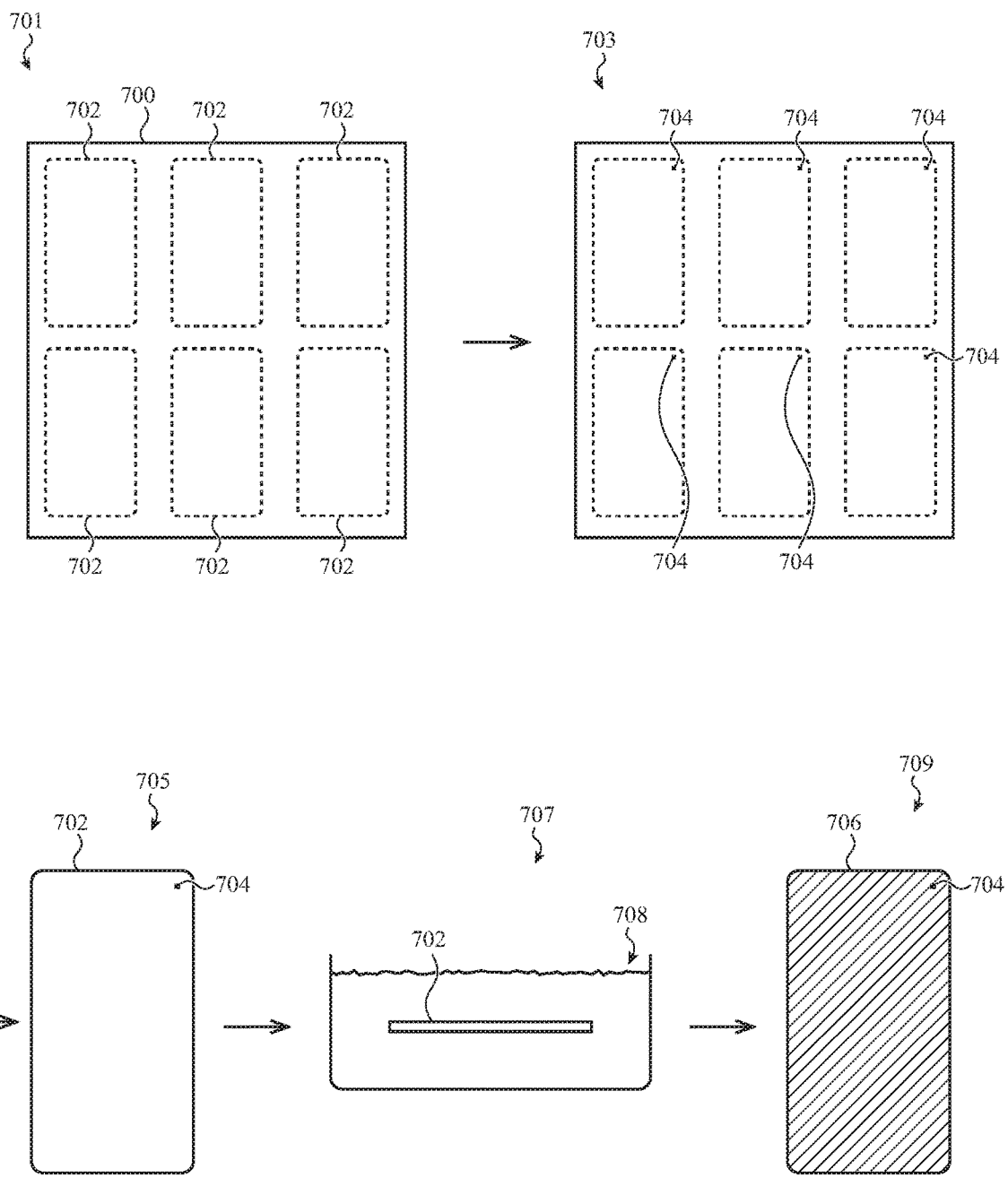
FIG. 7 depicts an example operation for marking and strengthening a glass member.

FIG. 7 illustrates an example processing workflow for marking, singulating, and strengthening glass covers according to the instant disclosure. At operation 701, a mother sheet 700 may be formed or otherwise obtained. The mother sheet 700 may be sized to produce multiple glass members 702 (e.g., which may be embodiments of the first glass member 106, FIG. 1A). While FIG. 7 shows broken lines indicating the borders of the glass members 702, these are for illustrative purposes and the mother sheet 700 need not include any markings or other features corresponding to the borders.

At operation 703, the mother sheet 700 may be laser marked with encoded markings 704. The encoded markings 704 may be formed within the glass sheet, as described herein (e.g., at or near a central plane between the upper and lower surfaces of the mother sheet 700). The information encoded in the encoded markings 704 may be unique, such that no two glass members will have the same encoded marking. The encoded markings 704 may be formed using techniques described herein (e.g., with a laser, and optionally using an index-matching material), and may have the properties and/or features of any encoded markings described herein.

At operation 705, the glass members 702 are singulated from the mother sheet with a cutting operation such as laser cutting, scoring and breaking, or any other suitable operation. At operation 707, one of the marked glass members 702 is subjected to a strengthening operation. For example, as shown, the marked glass member 702 is placed in an ion exchange bath 708. The ion exchange bath 708 may include molten salt having a temperature above an ambient temperature. For example, the molten salt bath may have a temperature above 300° C., above 400° C., or otherwise be heated to a temperature that is above ambient temperature and may have a significant impact on a physical or chemical property of the glass. Thus, when the marked glass member 702 is placed in the molten salt bath, it is heated as a result of the contact between the bath and the glass. As noted above, the marking 704 may be configured so that it does not fade or become damaged as a result of the heating from the ion exchange bath. Other strengthening techniques may be used in addition to or instead of the ion exchange bath, such as thermal tempering, additional ion exchange operations, application of ion exchange pastes or liquids (e.g., without submersion into a bath), or the like. Where strengthening is achieved with ion exchange baths, the bath may include any suitable material and may be configured to exchange or implant any suitable type of ion or other material into the glass (e.g., potassium ions, sodium ions, etc.).

At operation 709, the glass member 702 is removed from the ion exchange bath, resulting in a chemically strengthened glass member 706 with an optically detectable encoded marking 704. In some cases, the strengthened glass member 706 (and optionally the singulated but un-strengthened glass member 702) may be optically analyzed to detect the encoded marking and ensure that it is detectable and decodable (e.g., that it has not been damaged or become unreadable). If an encoded marking is determined to be unreadable, undecodable, or otherwise does not pass a quality standard, the glass member may be rejected (e.g., discarded and/or not incorporated into a device).

While FIG. 7 illustrates one example sequence of processing operations, this is merely one example sequence. In various embodiments, more, fewer, or different operations may be used. For example, one or more polishing operations may be performed on the mother sheet 700 prior to or after a laser marking operation, more or different chemical strengthening operations may be performed, and the like. As another example, chemical strengthening may be performed on a mother sheet 700 after laser marking but before singulation of individual glass members. Other variations are also contemplated.

Figure 8A:
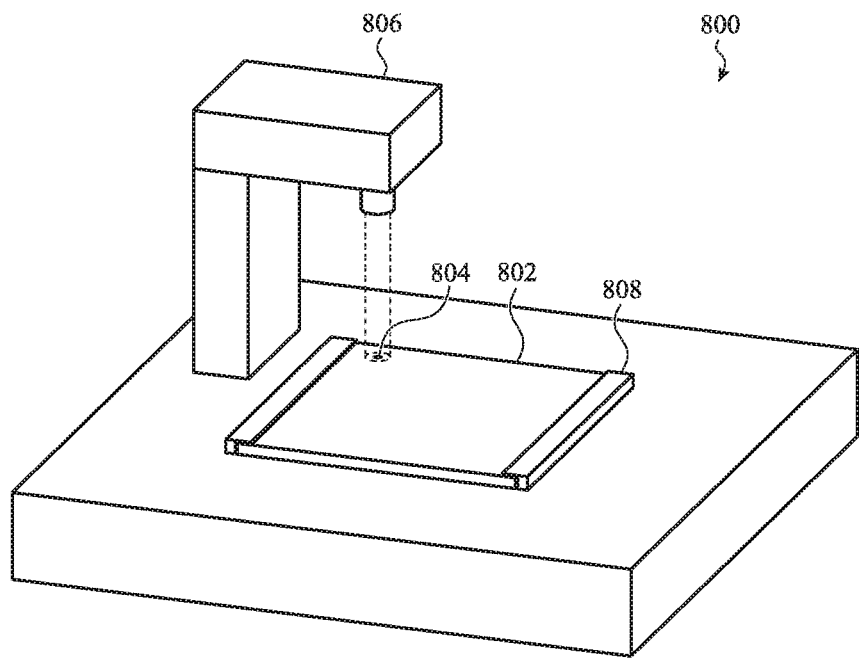
FIG. 8A depicts an example optical analysis system.
Figure 8B:
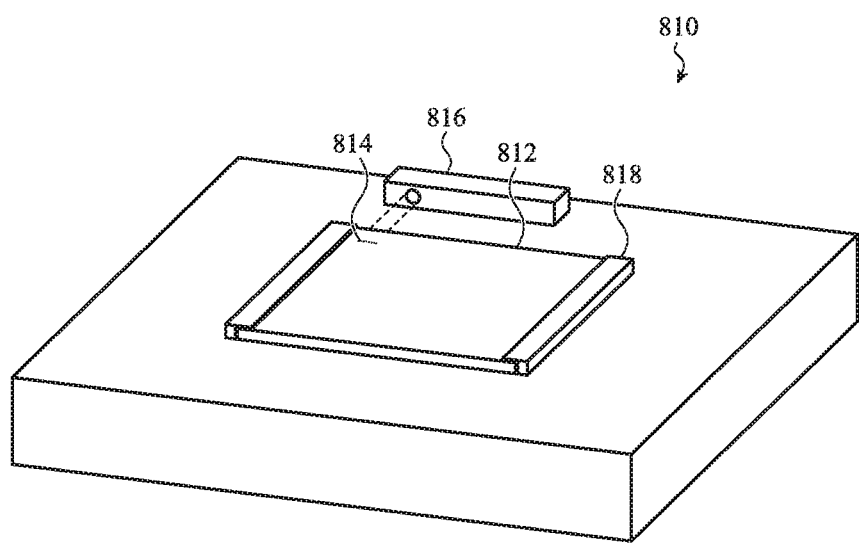
FIG. 8B depicts another example optical analysis system.

FIGS. 8A-8B illustrate example techniques for optically analyzing an encoded glass member. Optical analysis of an encoded glass member may be used to validate the presence and readability of the encoded marking after laser marking, strengthening, and/or polishing operations. Optical analysis may also be performed on complete devices that include marked glass members. For example, if a device is returned to the manufacturer for repair, the manufacturer may optically analyze the encoded marking to determine information about the glass member or the overall device. In some cases, the information represented by the encoded marking acts as a unique identifier of an entire device, and information about many aspects of the device may have been associated with the unique identifier.

FIG. 8A shows an example optical analysis system 800. The optical analysis system 800 includes an optical magnification apparatus 806 that is configured to magnify, focus on, and capture images of encoded markings. The optical magnification apparatus 806 may be capable of magnification levels of 100×, 200×, 400×, 500×, 1000×, or any other suitable magnification levels. The optical magnification apparatus 806 may include lenses, image sensors, light sources, and any other suitable components. The optical analysis system 800 may also include one or more light sources configured to direct light into the glass member to aid the optical analysis system in focusing on and capturing images of encoded markings.

The optical analysis system 800 also includes a fixture 808 for securing a glass member 802 with an encoded marking 804. More particularly, the fixture 808 may cause the glass member 802 to be held fixed in a location where the encoded marking 804 is aligned with the imaging path of the optical magnification apparatus 806. In this way, simply placing the glass member 802 in the fixture 808 may result in the encoded marking being correctly aligned for optical analysis and imaging of the encoded marking 804. Once the glass member 802 is placed in the fixture 808, the optical magnification apparatus 806 may locate, focus on, and optionally capture an image of the encoded marking 804. The optical magnification apparatus 806 may decode the encoded marking 804 and provide the decoded information to an operator and/or to another system for further analysis and/or to retrieve information associated with the encoded marking 804.

FIG. 8A shows an optical analysis system 800 that is configured to optically detect encoded markings through an upper surface of the glass member. Optical analysis systems may have different configurations for viewing and/or analyzing encoded markings that are intended to be viewed through different surfaces. For example, FIG. 8B shows an example optical analysis system 810 that is configured to view markings through a side surface of a glass member. Like the optical analysis system 800, the optical analysis system 810 includes a fixture 818 that positions a glass member 812 (with an encoded marking 814) so that an optical magnification apparatus 816 is aligned with and can readily locate, focus on, and optionally capture an image of the encoded marking 814 through a side surface of the glass member 812.

While FIGS. 8A-8B illustrate bare glass members in the fixtures, in some cases the optical analysis systems are configured to receive and align other objects that include the glass members. For example, the fixtures may be configured to receive complete devices (e.g., tablet computers, mobile phones, wearable devices such as watches), portions of devices (e.g., the upper or "display" portion of a notebook computer), mother sheets, glass members held in processing fixtures or holders, and so forth. The fixtures may be configured to align the devices so that the encoded marking is properly positioned for optical analysis, as described above.

Figure 9:
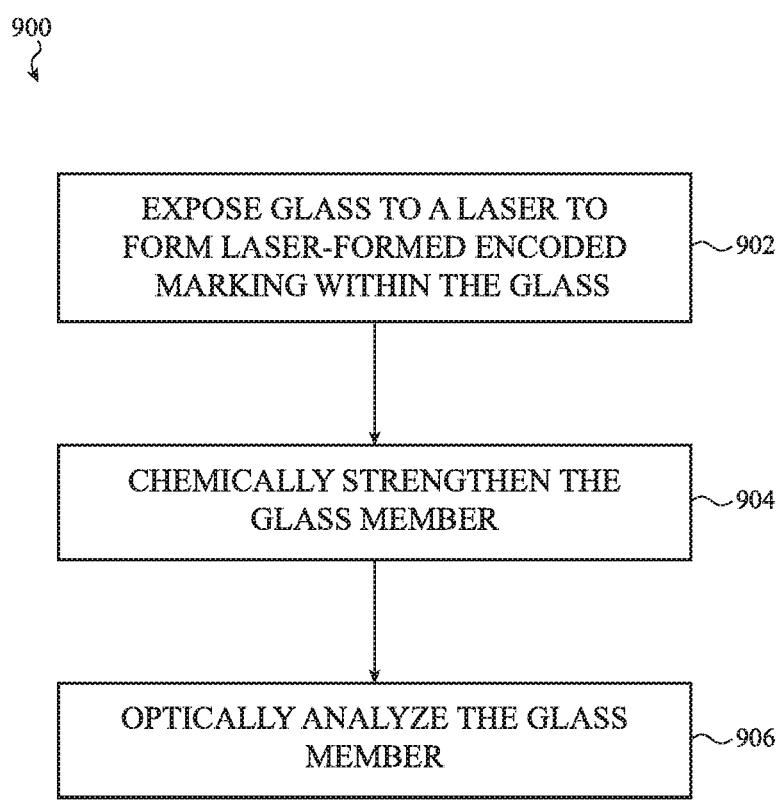
FIG. 9 is a flow chart of an example method of forming a strengthened glass member with an encoded marking.

FIG. 9 is a flow chart of an example method 900 for forming a glass member with an encoded marking. At operation 902, glass is exposed to a laser to form a laser-formed encoded marking within the glass member. As described above, laser forming the encoded marking may include directing a laser beam through at least one surface of the glass member and focusing the beam to form the encoded marking at a location between an upper and a lower surface of the glass member. The encoded marking may include a group of discrete marks each having a dimension between about 3 microns and about 10 microns. The discrete marks may be arranged in a pattern that corresponds to a two-dimensional array, where the two-dimensional array is defined or generated by encoding a unique identifier into the two-dimensional array.

The operation of laser forming the encoded marking may also include applying an index-matching material to a surface of the glass member, and directing the laser beam through the index-matching material and through the upper surface of the glass member to form the encoded marking. The encoded marking produced via the laser marking operation may be configured to survive heating, strengthening, polishing, grinding, and/or other operations.

At operation 902, after laser forming the encoded marking, the glass member is chemically strengthened. Chemically strengthening may include placing the glass member in an ion exchange bath, and while the glass member is in the ion exchange bath, heating the glass member as a result of contact between the glass member and the ion exchange bath. In some cases, the glass member may be heated above a particular temperature, such as above 300° C.

At operation 904, after removing the glass member from the ion exchange bath, the glass member may be optically analyzed to optically detect the encoded marking. Optically analyzing the glass member may include placing the glass member in a fixture (e.g., the fixtures 808, 818, FIGS. 8A-8B) configured to position the encoded marking in a fixed position relative to an optical magnification apparatus (e.g., the optical magnification apparatuses 806, 816), and capturing an image of the encoded marking with the optical magnification apparatus.

As noted above, the encoded marking may be decoded by an optical analysis system (with or without a persistent image file being saved) to extract information from the encoded marking, and the information extracted from the encoded marking may be associated with data relating to the glass member. For example, information about processes to which the glass member has been subjected may be associated with the information from the encoded marking.

After chemical strengthening the glass member, an opaque coating may be applied to at least a portion of a lower surface of the glass member, thereby defining an opaque region of the glass member that may, for example, frame or border a display. In other cases, the opaque coating may be applied to the entire glass member, such as where the glass member does not cover a display or otherwise need to allow underlying displays or components to be viewed therethrough.

Figure 10:
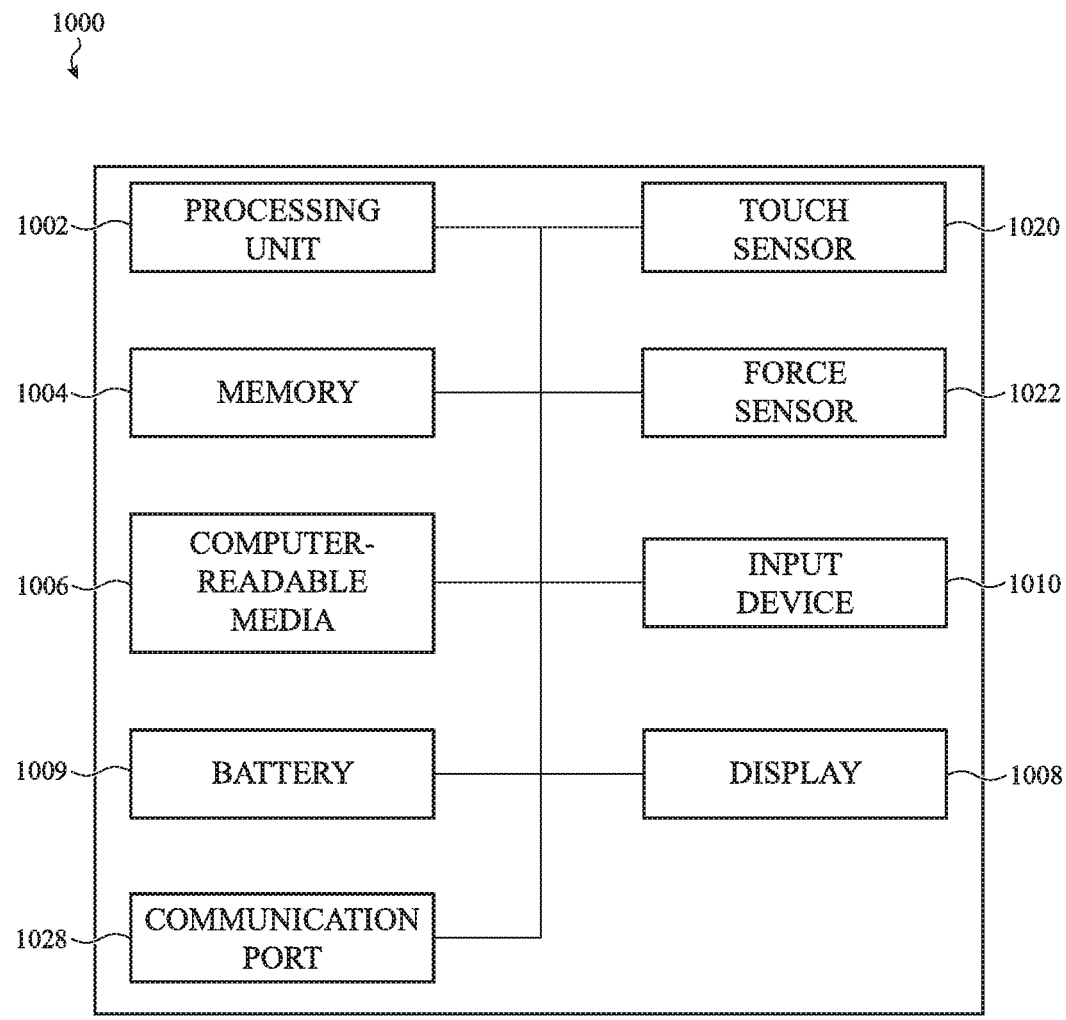
FIG. 10 depicts example components of an electronic device.

FIG. 10 depicts an example schematic diagram of an electronic device 1000. By way of example, the device 1000 of FIG. 10 may correspond to the electronic device 100 shown in FIGS. 1A-1C (or any other electronic device described herein). To the extent that multiple functionalities, operations, and structures are disclosed as being part of, incorporated into, or performed by the device 1000, it should be understood that various embodiments may omit any or all such described functionalities, operations, and structures. Thus, different embodiments of the device 1000 may have some, none, or all of the various capabilities, apparatuses, physical features, modes, and operating parameters discussed herein.

As shown in FIG. 10, a device 1000 includes a processing unit 1002 operatively connected to computer memory 1004 and/or computer-readable media 1006. The processing unit 1002 may be operatively connected to the memory 1004 and computer-readable media 1006 components via an electronic bus or bridge. The processing unit 1002 may include one or more computer processors or microcontrollers that are configured to perform operations in response to computer-readable instructions. The processing unit 1002 may include the central processing unit (CPU) of the device. Additionally or alternatively, the processing unit 1002 may include other processors within the device including application specific integrated chips (ASIC) and other microcontroller devices.

The memory 1004 may include a variety of types of non-transitory computer-readable storage media, including, for example, read access memory (RAM), read-only memory (ROM), erasable programmable memory (e.g., EPROM and EEPROM), or flash memory. The memory 1004 is configured to store computer-readable instructions, sensor values, and other persistent software elements. Computer-readable media 1006 also includes a variety of types of non-transitory computer-readable storage media including, for example, a hard-drive storage device, a solid-state storage device, a portable magnetic storage device, or other similar device. The computer-readable media 1006 may also be configured to store computer-readable instructions, sensor values, and other persistent software elements.

In this example, the processing unit 1002 is operable to read computer-readable instructions stored on the memory 1004 and/or computer-readable media 1006. The computer-readable instructions may adapt the processing unit 1002 to perform operations or functions of the device 1000. The computer-readable instructions may be provided as a computer-program product, software application, or the like.

As shown in FIG. 10, the device 1000 also includes a display 1008. The display 1008 may include a liquid-crystal display (LCD), organic light emitting diode (OLED) display, light emitting diode (LED) display, or the like. If the display 1008 is an LCD, the display 1008 may also include a backlight component that can be controlled to provide variable levels of display brightness. If the display 1008 is an OLED or LED type display, the brightness of the display 1008 may be controlled by modifying the electrical signals that are provided to display elements. The display 1008 may be activated during an optical analysis operation to help illuminate an encoded marking or otherwise aid in the optical detection and optional imaging of an encoded marking. The display 1008 may correspond to any of the displays shown or described herein.

The device 1000 may also include a battery 1009 that is configured to provide electrical power to the components of the device 1000. The battery 1009 may include one or more power storage cells that are linked together to provide an internal supply of electrical power. The battery 1009 may be operatively coupled to power management circuitry that is configured to provide appropriate voltage and power levels for individual components or groups of components within the device 1000. The battery 1009 may store received power so that the device 1000 may operate without connection to an external power source for an extended period of time, which may range from several hours to several days.

In some embodiments, the device 1000 includes one or more input devices 1010. An input device 1010 is a device that is configured to receive user input. The one or more input devices 1010 may include, for example, a crown input system, a push button, a touch-activated button, a keyboard, a key pad, or the like (including any combination of these or other components). In some embodiments, the input device 1010 may provide a dedicated or primary function, including, for example, a power button, volume buttons, home buttons, scroll wheels, and camera buttons.

The device 1000 may also include a touch sensor 1020 that is configured to determine a location of a touch on a touch-sensitive surface of the device 1000 (e.g., an input surface defined by the portion of a glass member that covers a display). The touch sensor 1020 may use or include capacitive sensors, resistive sensors, surface acoustic wave sensors, piezoelectric sensors, strain gauges, or the like. In some cases the touch sensor 1020 associated with a touch-sensitive surface of the device 1000 may include a capacitive array of electrodes or nodes that operate in accordance with a mutual-capacitance or self-capacitance scheme. The touch sensor 1020 may be integrated with one or more layers of a display stack (e.g., the display assembly 111) to provide the touch-sensing functionality of a touchscreen.

The device 1000 may also include a force sensor 1022 that is configured to receive and/or detect force inputs applied to a user input surface of the device 1000 (e.g., the display 109). The force sensor 1022 may use or include capacitive sensors, resistive sensors, surface acoustic wave sensors, piezoelectric sensors, strain gauges, or the like. In some cases, the force sensor 1022 may include or be coupled to capacitive sensing elements that facilitate the detection of changes in relative positions of the components of the force sensor (e.g., deflections caused by a force input). The force sensor 1022 may be integrated with one or more layers of a display stack (e.g., the display assembly 111) to provide force-sensing functionality of a touchscreen.

The device 1000 may also include a communication port 1028 that is configured to transmit and/or receive signals or electrical communication from an external or separate device. The communication port 1028 may be configured to couple to an external device via a cable, adaptor, or other type of electrical connector. In some embodiments, the communication port 1028 may be used to couple the device 1000 to an accessory, including a dock or case, a stylus or other input device, smart cover, smart stand, keyboard, or other device configured to send and/or receive electrical signals.

Devices such as those described herein (e.g., wearable electronic devices, electronic watches, smartphones, tablets, etc.) may gather and use data from and/or about a user. It is well understood that the use of personally identifiable information (such as information from or about a user or the user's environment and that is stored on or accessible by a device) should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings. Also, when used herein to refer to positions of components, the terms above and below, or their synonyms, do not necessarily refer to an absolute position relative to an external reference, but instead refer to the relative position of components with reference to the figures.

What is claimed is:

1. An electronic device, comprising:
 a housing;
 a display positioned at least partially within the housing;
 a cover assembly coupled to the housing and comprising a chemically strengthened glass member; and
 an encoded marking formed within the chemically strengthened glass member and comprising an array of marks, each mark of at least a subset of the array of marks:
  having a dimension between about 3 microns and about 10 microns;
  set apart from an adjacent mark by an unmarked area of the chemically strengthened glass member; and
  positioned entirely between an upper surface of the chemically strengthened glass member and a lower surface of the chemically strengthened glass member.

2. The electronic device of claim 1, wherein:
 the cover assembly defines:
  a transparent region positioned over the display and configured to allow graphical outputs of the display to be viewed through the cover assembly; and
  an opaque region at least partially surrounding the transparent region; and
 the encoded marking is in the opaque region.

3. The electronic device of claim 1, wherein each mark represents a bit of information in a binary number system.

4. The electronic device of claim 1, wherein:
 the chemically strengthened glass member defines:
  a first compressive stress region extending to a first depth into the chemically strengthened glass member from the upper surface;
  a second compressive stress region extending to a second depth into the chemically strengthened glass member from the lower surface; and
  a tensile stress region between the first and second compressive stress regions; and
 the encoded marking is in the tensile stress region.

5. The electronic device of claim 1, wherein the encoded marking is readable, by an optical magnification apparatus, through the upper surface.

6. The electronic device of claim 1, wherein the encoded marking is readable, by an optical magnification apparatus, through a side surface of the chemically strengthened glass member, the side surface extending from the upper surface to the lower surface and defining an exterior surface of the electronic device.

7. The electronic device of claim 1, wherein the encoded marking is formed before the chemically strengthened glass member is subjected to a chemical strengthening operation.

8. An electronic device, comprising:
a housing;
a display positioned at least partially within the housing; and
a chemically strengthened glass member at least partially covering the display and defining:
a first surface defining an exterior surface of the device and configured to receive touch inputs from a user;
a second surface opposite the first surface; and
an encoded marking within the chemically strengthened glass member and comprising:
a group of marks, at least a subset of the marks in the group of marks positioned a first distance below the first surface of the chemically strengthened glass member and a second distance above the second surface of the chemically strengthened glass member and having a dimension between about 3 microns and about 10 microns.

9. The electronic device of claim 8, wherein:
the group of marks is a first group of marks;
the first group of marks is a first portion of an array representing encoded information; and
the encoded marking further comprises a second group of marks set apart from the first group of marks, each mark in the second group of marks having a dimension between about 3 microns and about 10 microns; and
the second group of marks is a second portion of the array representing the encoded information.

10. The electronic device of claim 9, wherein the encoded marking further comprises:
a third group of marks set apart from the first and second group of marks, each mark in the third group of marks having a dimension between about 3 microns and about 10;
a fourth group of marks set apart from the first, second, and third groups of marks, each mark in the fourth group of marks having a dimension between about 3 microns and about 10;
the chemically strengthened glass member defines a shape with four corners; and
each of the first, second, third, and fourth groups of marks is positioned proximate a respective corner of the four corners.

11. The electronic device of claim 9, wherein the first group of marks and the second group of marks are not visible to an unaided eye.

12. The electronic device of claim 9, wherein a distance between the first group of marks and the second group of marks is greater than a distance between any two marks in the first group of marks.

13. The electronic device of claim 9, wherein the marks of the first and second groups of marks have a different index of refraction than an unmarked region of the chemically strengthened glass member.

14. A method of marking a glass member for an electronic device, comprising:
laser forming, along an interior of the glass member, an encoded marking comprising a group of discrete marks each having a dimension between about 3 microns and about 10 microns; and
after laser forming the encoded marking, chemically strengthening the glass member, comprising:
placing the glass member in an ion exchange bath; and
while the glass member is in the ion exchange bath, heating the glass member as a result of contact between the glass member and the ion exchange bath.

15. The method of claim 14, wherein:
the method further comprises encoding a unique identifier into a two-dimensional array; and
the discrete marks are arranged in a pattern that corresponds to the two-dimensional array.

16. The method of claim 15, further comprising:
removing the glass member from the ion exchange bath; and
after removing the glass member from the ion exchange bath, optically analyzing the glass member to optically detect the encoded marking.

17. The method of claim 16, wherein:
optically analyzing the glass member comprises:
placing the glass member in a fixture configured to position the encoded marking in a fixed position relative to an optical magnification apparatus; and
capturing an image of the encoded marking with the optical magnification apparatus;
decoding the encoded marking to extract the unique identifier from the encoded marking; and
the method further comprises associating data relating to the glass member with the unique identifier.

18. The method of claim 14, wherein:
the glass member defines:
an upper surface; and
a lower surface;
the encoded marking is positioned between a first area of the upper surface and a second area of the lower surface; and
the method further comprises after chemically strengthening the glass member, applying an opaque coating to at least the second area of the lower surface.

19. The method of claim 14, wherein laser forming the encoded marking comprises:
laser forming a first partial marking in a first region of the glass member; and
laser forming a second partial marking in a second region of the glass member, the second region set apart from the first region.

20. The method of claim 14, wherein laser forming the encoded marking comprises:
applying an index-matching material to a surface of the glass member; and
directing a laser beam through the index-matching material and through the surface to form the group of discrete marks.

* * * * *